(12) United States Patent
Nagano et al.

(10) Patent No.: US 7,521,300 B2
(45) Date of Patent: Apr. 21, 2009

(54) SEMICONDUCTOR DEVICE SUBSTRATE INCLUDING A SINGLE-CRYSTALLINE LAYER AND METHOD OF MANUFACTURING SEMICONDUCTOR DEVICE SUBSTRATE

(75) Inventors: Hajime Nagano, Yokohama (JP); Takashi Yamada, Ebina (JP); Tsutomu Sato, Yokohama (JP); Ichiro Mizushima, Yokohama (JP); Hisato Oyamatsu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 11/455,735

(22) Filed: Jun. 20, 2006

(65) Prior Publication Data

US 2006/0234478 A1     Oct. 19, 2006

Related U.S. Application Data

(62) Division of application No. 10/237,206, filed on Sep. 9, 2002, now Pat. No. 7,187,035.

(30) Foreign Application Priority Data

Sep. 26, 2001     (JP)     ............................. 2001-293781

(51) Int. Cl.
     *H01L 21/762*     (2006.01)
(52) U.S. Cl. .................. 438/152; 438/164; 438/166; 257/E21.561
(58) Field of Classification Search ......... 438/149–166; 257/E21.561
     See application file for complete search history.

(56) References Cited

U.S. PATENT DOCUMENTS 5,006,317 A     4/1991     Sanjurjo (Continued)

FOREIGN PATENT DOCUMENTS

CN     1264157 A     8/2000

(Continued)

OTHER PUBLICATIONS

Hannon et al.; "0.25 μm Merged Bulk Dram and SOI Logic Using Patterned SOI"; IEEE Symposium on VLSI Technology Digest of Technical Papers, pp. 66-67, (2000).

(Continued)

*Primary Examiner*—Marcos D. Pizarro
(74) *Attorney, Agent, or Firm*—Finnegan, Henderson, Farabow, Garrett & Dunner, L.L.P.

(57) ABSTRACT

A method of manufacturing a semiconductor device substrate includes forming a mask layer pattern on a semiconductor layer insulated from a surface of a semiconductor substrate by an electrically insulating layer, etching the semiconductor layer according to the pattern of the mask layer to form a trench leading to the insulating layer, etching a protective layer on the semiconductor substrate having a thickness less than the thickness of the insulating layer to form a sidewall protective film which covers a side surface of the trench, etching the insulating layer from a bottom surface of the trench to the semiconductor substrate; and growing a single-crystalline layer from the surface of the semiconductor substrate exposed as a result of etching the insulating layer.

7 Claims, 5 Drawing Sheets

U.S. PATENT DOCUMENTS

| | | | |
|---|---|---|---|
| 5,399,507 A * | 3/1995 | Sun | 438/152 |
| 5,847,438 A | 12/1998 | Kikuchi et al. | |
| 5,894,152 A | 4/1999 | Jaso et al. | |
| 6,110,278 A | 8/2000 | Saxena | |
| 6,180,486 B1 | 1/2001 | Leobandung et al. | |
| 6,531,754 B1 * | 3/2003 | Nagano et al. | 257/510 |

FOREIGN PATENT DOCUMENTS

| | | |
|---|---|---|
| JP | 7-106434 | 4/1995 |
| JP | 8-17694 | 1/1996 |
| JP | 8-316431 | 11/1996 |
| JP | 10-303385 | 11/1998 |
| JP | 11-17001 | 1/1999 |
| JP | 11-238860 | 8/1999 |
| JP | 2000-91534 | 3/2000 |
| JP | 2000-243944 | 9/2000 |
| KR | 1999-006452 | 1/1999 |

OTHER PUBLICATIONS

Ho et al.; "A 0.13 μm High-Performance SOI Logic Technology With Embedded Dram for System-on-a-Chip Application"; IEEE IEDM 01, pp. 503-506, (2001).

Nagano et al.; "Manufacturing Method of Partial SOI Wafer, Semiconductor Device Using the Partial SOI Wafer and Manufacturing Method Thereof"; U.S. Appl. No. 10/083,131, filed Feb. 27, 2002.

Nagano et al.; "Semiconductor Device Formed in Semiconductor Layer Arranged on Substrate With One of Insulating Film and Cavity Interposed Between the Substrate and the Semiconductor Layer"; U.S. Appl. No. 10/091,448, filed Mar. 7, 2002.

Yamada et al.; "Semiconductor Device Having One of Patterned SOI and SON Structure"; U.S. Appl. No. 10/096,655, filed Mar. 14, 2002.

Nagano et al.; "Semiconductor Device Using Partial SOI Substrate and Manufacturing Method Thereof"; U.S. Appl. No. 10/078,344, filed Feb. 21, 2002.

Oyamatsu; "Semiconductor Device Having Patterned SOI Structure and Method for Fabricating the Same"; U.S. Appl. No. 10/075,465, filed Feb. 15, 2002.

* cited by examiner

SEMICONDUCTOR DEVICE SUBSTRATE INCLUDING A SINGLE-CRYSTALLINE LAYER AND METHOD OF MANUFACTURING SEMICONDUCTOR DEVICE SUBSTRATE

CROSS-REFERENCE TO RELATED APPLICATIONS

This is a divisional of application Ser. No. 10/237,206, filed Sep. 9, 2002 now U.S. Pat. No. 7,187,035, which is incorporated in its entirety by reference. This application is also based upon and claims priority from prior Japanese Patent Application No. 2001-293781, filed Sep. 26, 2001, the entire contents of which are incorporated herein by reference.

BACKGROUND OF THE INVENTION

1. Field of the Invention

This invention relates to a semiconductor device substrate and a method of manufacturing a semiconductor device substrate.

2. Description of the Related Art

Field-effect transistors formed on an SOI (Silicon On Insulator) substrate, which can operate at high speed, enable a high-speed logic circuit to be constructed. Recently, there have been strong demands for such semiconductor devices as system LSIs that include both high-speed logic circuits and DRAMs.

When a DRAM is formed on an SOI layer, charges are accumulated in the body region of a memory cell transistor of the DRAM because of the substrate floating effect of the SOI layer, which results in the degradation of the retention due to an unexpected leak in the DRAM or a shift in the threshold voltage or the like of the pair transistor in the sense amplifier circuit.

In order to completely cancel the substrate-floating effect, it is necessary to form a contact region and a lead-out region from the body section of each MOSFET and control the body potential. However, in order to meet above requirement, the cell area and the area of the sense amplifier section are made extremely large, thereby losing the high integration density, which is the best feature of a DRAM.

To overcome this drawback, there is a method of forming a substrate with an SOI region and a non-SOI region (hereinafter, referred to as a partial SOI substrate). The SOI region has a semiconductor layer formed on an insulating layer formed on a semiconductor substrate. The non-SOI region has a single-crystalline layer formed on the semiconductor substrate without an insulating layer between them.

The semiconductor device formed in the non-SOI region is unaffected by the substrate floating effect. Therefore, forming a field-effect transistor in the SOI region and a DRAM in the non-SOI region makes it possible to form a system LSI that includes a high-speed logic circuit and a DRAM unaffected by the substrate floating effect.

A first method of forming a partial SOI substrate is a SIMOX (Separation by Implantation of Oxygen) method (disclosed in Jpn. Pat. Appln. KOKAI Publication No. 10-303385 or discussed in 2000 Symposium on VLSI Technology Digest of Technical Papers, pp. 66 and 67). A second method of forming the partial SOI substrate is a method of bonding a silicon substrate to a silicon substrate on which an insulating film is patterned (Jpn. Pat. Appln. KOKAI Publication No. 8-316431). A third method of forming the partial SOI substrate is a method of etching partially the SOI layer and insulating layer of an SOI substrate (hereinafter, also referred to as a BOX (Buried Oxide) layer) to remove them (Jpn. Pat. Appln. KOKAI Publication No. 7-106434, Jpn. Pat. Appln. KOKAI Publication No. 11-238860, or Jpn. Pat. Appln. KOKAI Publication No. 2000-91534).

In the first method, or the SIMOX method, since oxygen ions are implanted, defects are liable to occur in a crystal of the SOI layer or a crystal in the bulk layer. In the second method, there is a region where silicon substrates are laminated together. Thus, the crystal orientation deviates in the portion where the silicon substrates are laminated, which causes crystal defects. In the third method, there is a step at the boundary between the SOI region and the non-SOI region, which has an adverse effect on subsequent processes. For example, the focus margin decreases in the lithographic process.

On the other hand, in the third method, although a step exists between the SOI region and the non-SOI region, there are fewer crystal defects in the SOI substrate than in the first and second methods. Therefore, the quality in the third method is better than that in the first and second methods.

To flatten a step occurring between the SOI region and the non-SOI region in the third method, there is a method of forming an epitaxial layer on the non-SOI region and polishing the epitaxial layer (Jpn. Pat. Appln. KOKAI Publication No. 2000-243994).

In this third method, however, since the BOX layer is etched by RIE (Reactive Ion Etching) techniques, the silicon substrate under the BOX layer is damaged by plasma, which causes crystal defects.

Accordingly, it is desirable that the BOX layer be selectively removed by wet etching based on chemical reaction using an NH4F solution or the like. However, since the wet etching using the solution is isotropic, the BOX layer is side-etched.

Figure 6A:
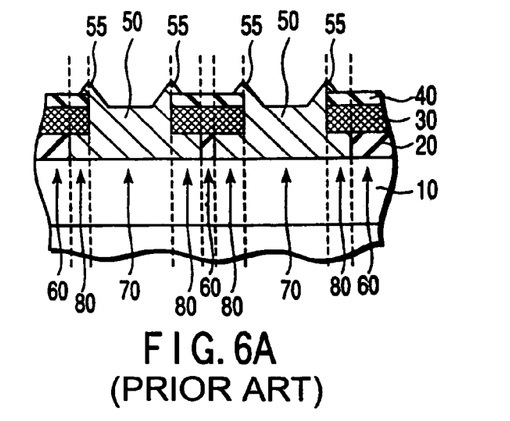
FIG. 6A shows a sectional view of a partial SOI substrate with an SOI region and a non-SOI region in a step of a conventional method.
Figure 6B:
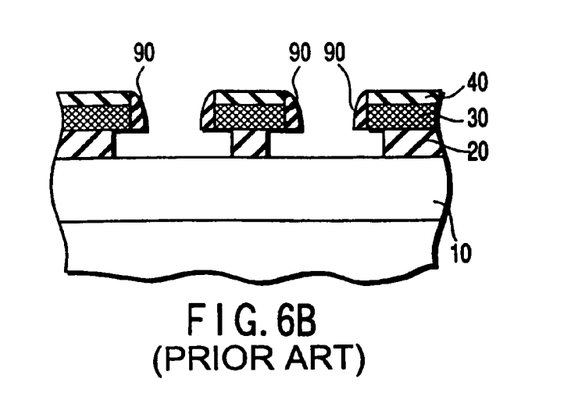
FIG. 6B shows a sectional view of the partial SOI substrate with an SOI region and a non-SOI region in a step of the conventional method.

FIGS. 6A and 6B show sectional views of a partial SOI substrate with an SOI region and a non-SOI region obtained by wet-etching a BOX layer 20 by a conventional method. In manufacture, over the main surface of a semiconductor substrate 10, a BOX layer 20, an SOI layer 30, and a mask layer 40 are formed in that order. Then, the mask layer 40 is patterned. Using the patterned mask layer 40, the SOI layer 30 is etched by RIE techniques. Using a solution, the BOX layer 20 is selectively wet-etched.

In the semiconductor substrate 10, the region where the BOX layer 20 and the SOI layer 30 remain is an SOI region 60. The region where the BOX layer 20 and the SOI layer are removed is a non-SOI region 70. It is assumed that the region where one of the BOX layer 20 and the SOI layer 30 remains and the other is removed is a boundary region 80.

In the non-SOI region 70, the semiconductor substrate 10 is exposed. A single-crystalline layer 50 is grown from the surface of the exposed semiconductor substrate 10.

The BOX layer 20 is subjected to wet etching, with the result that the BOX layer 20 is side-etched not only in a substrate direction going toward the semiconductor substrate 10 but also in a lateral direction perpendicular to the direction going toward the surface of the semiconductor substrate 10. As a result, in a pattern where the width of the SOI layer is less than twice the side-etched width, the SOI layer 30 can lift off. In addition, when the single-crystalline layer 50 is grown, a single crystal also grows from the side face of the SOI layer 30. Since the SOI layer 30 is higher in position than the surface of the semiconductor substrate 10, a single crystal from the side face of the SOI layer 30 grows higher than a single crystal from the semiconductor substrate 10. As a result, a bump 55 is formed in or around the boundary region 80 (see FIG. 6A). At the surface of the semiconductor device substrate near the bump 55, a crystal defect takes place. To form a flat semiconductor device substrate, the process of polishing the bump 55 is needed.

Since the mask layer 40 is removed in a later process, if the flat surface of the single-crystalline layer 50 and the surface of the SOI layer 30 are in the same plane, the surface of the substrate is flat. Therefore, in FIG. 6A, the flat surface of the single-crystalline layer 50 and the surface of the SOI layer are drawn so as to be at the same level.

To overcome these problems, there is a method of covering the side face of the SOI layer 30 with a sidewall protective film 90 after the SOI layer 30 is etched. This method reduces the possibility that the SOI layer 30 will lift off.

However, in a case where the sidewall protective film 90 is thinner than the BOX layer 20, when the BOX layer 20 is etched, the back of the SOI layer 30 is exposed. As a result, the single crystal still grows from the back of the SOI layer 30, with the result that a bump 55 is formed in or around the boundary region 80.

On the other hand, forming a sidewall protective film 90 thicker than the BOX layer 20 causes manufacturing costs to increase and makes the process of forming the sidewall protective film 90 complicated, which is not desirable.

BRIEF SUMMARY OF THE INVENTION

According to a first aspect of the present invention, there is provided a method of manufacturing a semiconductor device substrate, comprising forming a mask layer pattern on a semiconductor layer insulated from a surface of a semiconductor substrate by an electrically insulating layer; etching at least the semiconductor layer according to the pattern of the mask layer to form a trench leading to the insulating layer; etching a protective layer on the semiconductor substrate having a thickness less than the thickness of the insulating layer to form a sidewall protective film which covers a side surface of the trench; etching the insulating layer from a bottom surface of the trench to the semiconductor substrate; and growing a single-crystalline layer from the surface of the semiconductor substrate exposed as a result of etching the insulating layer.

According to a second aspect of the present invention, there is provided a method of manufacturing a semiconductor device substrate, comprising forming a mask layer pattern on a semiconductor layer insulated from a surface of a semiconductor substrate by an electrically insulating layer; etching at least the semiconductor layer isotropically according to the pattern of the mask layer to etch the semiconductor layer under the mask layer toward a side surface of the trench to form a trench leading to the insulating layer; etching the insulating layer from a bottom surface of the trench to the semiconductor substrate isotropically to etch the insulating layer under the semiconductor layer toward the side surface of the trench; and growing a single-crystalline layer from the surface of the semiconductor substrate exposed as a result of etching the insulating layer.

According to a third aspect of the present invention, there is provided a substrate for a semiconductor device comprising a semiconductor substrate; an insulating region where an electrically insulating layer and a semiconductor layer insulated by the insulating layer are formed on a surface of the semiconductor substrate; a non-insulating region where a single-crystalline layer is formed on the surface of the semiconductor substrate; and a sidewall protective film which covers a side surface of at least the semiconductor layer existing in a boundary region between the insulating region and the non-insulating region, wherein a side surface of the insulating layer existing in the boundary region between the insulating region and the non-insulating region is closer to the non-insulating region than the side surface of the semiconductor layer.

According to a fourth aspect of the present invention, there is provided a substrate for a semiconductor device comprising a semiconductor substrate; an insulating region where a first electrically insulating layer and a semiconductor layer insulated by the first insulating layer are formed on the surface of the semiconductor substrate and a second electrically insulating layer is formed on the semiconductor layer; and a non-insulating region where a single-crystalline layer is formed on the surface of the semiconductor substrate, wherein a side surface of the semiconductor layer and a side surface of the first insulating layer existing at a boundary between the insulating region and the non-insulating region are closer to the insulating region than a side surface of the second insulating layer existing at the boundary between the insulating region and the non-insulating region.

DETAILED DESCRIPTION OF THE INVENTION

Hereinafter, referring to the accompanying drawings, embodiments of the present invention will be explained. The present invention is not limited by any of the embodiments. All the figures are schematically drawn to make it easy to understand. Any combination of the embodiments explained below will easily occur to those skilled in the art.

FIGS. 1A-1E show sectional views of a semiconductor device substrate in the order of steps to help explain a method of manufacturing a semiconductor device substrate according to a first embodiment of the present invention.

Figure 1A:
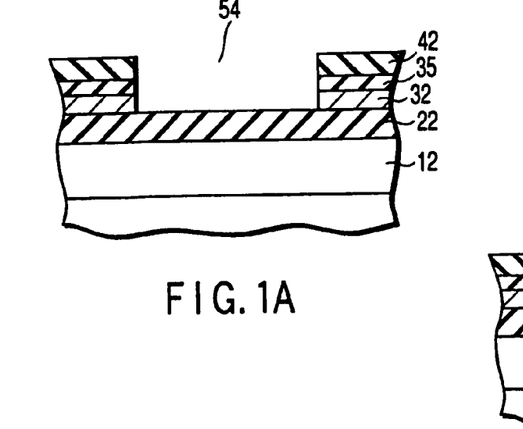
FIG. 1A shows a sectional view of a semiconductor device substrate in a step of a method of manufacturing a semiconductor device substrate according to a first embodiment of the present invention.

In FIG. 1A, an insulating layer 22, which has an electrically insulating property, is formed on the surface of the semiconductor substrate 12. Then, a semiconductor layer 32 insulated by the insulating layer 22 from the semiconductor substrate is formed on the insulating layer 22. That is, an SOI structure is formed on the semiconductor substrate 12. A commercially available SOI substrate may be used.

On the semiconductor layer 32, a mask layer is formed and patterned. In the present first embodiment, an oxide layer 35 is formed on the semiconductor layer 32. On the oxide layer 35, a nitride layer 42 is formed. That is, two layers of the mask layers 35, 42 are formed. The oxide layer 35 decreases the stress applied by the nitride film 42 to the semiconductor layer 32, thereby protecting the semiconductor layer 32. The two layers of the mask layers 35, 42 are subjected to patterning.

The semiconductor substrate 12 and the semiconductor layer 32 are, for example, a silicon substrate and a silicon layer, respectively. The insulating layer 22 and the oxide layer 35 are, for example, silicon oxide films. The nitride film 42 is, for example, a silicon nitride film. In the present first embodiment, the thickness of the insulating layer 22 is about 400 nm or about 200 nm. The thickness of the semiconductor layer 32 is about 200 nm.

Next, the semiconductor layer 32 is selectively etched according to the patterned mask layers 35, 42. As a result, a trench 54 reaching the insulating layer 22 is formed. The trench 54 is such that the surface portion of the insulating layer 22 exposed as a result of etching the semiconductor layer 32 is the bottom surface of the trench 54 and the side portion of the semiconductor layer 32 exposed as a result of etching the semiconductor layer 32 is the side surface.

Figure 1B:
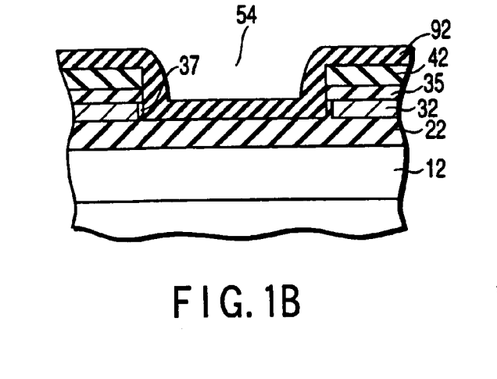
FIG. 1B shows a sectional view of the semiconductor device substrate in a step of the method of manufacturing a semiconductor device substrate according to the first embodiment of the present invention.

In FIG. 1B, the semiconductor layer 32 is then oxidized, thereby forming an oxide layer 37 on the side surface of the trench 54. Furthermore, a protective layer 92 thinner than the insulating layer 22 is deposited on the semiconductor layer 12. In the present first embodiment, the protective layer 92 is deposited by LPCVD (Low Pressure Chemical Vapor Deposition) techniques. The protective layer 92 is made of, for example, nitride material or oxide material. In the present first embodiment, the protective layer 92 is made of nitride material. The oxide layer 37 protects the semiconductor layer 32 from the protective layer 92.

Figure 1C:
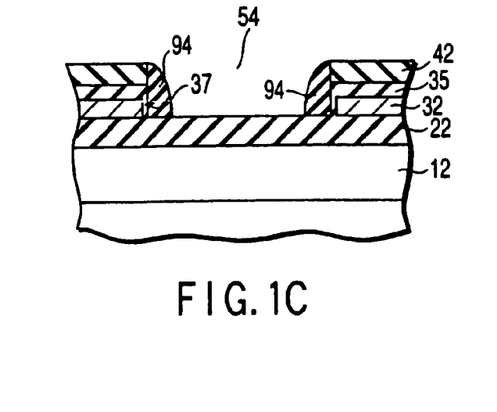
FIG. 1C shows a sectional view of the semiconductor device substrate in a step of the method of manufacturing a semiconductor device substrate according to the first embodiment of the present invention.

In FIG. 1C, the protective layer 92 is etched anisotropically toward the surface of the semiconductor substrate 12, with the result that a sidewall protective film 94 remains on the side surface of the trench 54. The sidewall protective film 94 covers the side surface of the trench 54.

When the sidewall protective film 94 is made of oxide material, it is etched at the same time as the insulating layer 22 is etched. However, making the film thickness Trf of the insulating layer 22 sufficiently smaller enables the surface of the semiconductor substrate 12 to be exposed without the exposure of the semiconductor layer 32.

Figure 1D:
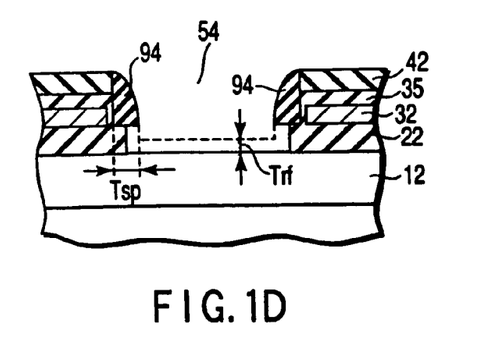
FIG. 1D shows a sectional view of the semiconductor device substrate in a step of the method of manufacturing a semiconductor device substrate according to the first embodiment of the present invention.

In FIG. 1D, the insulating layer 22 existing from the bottom surface of the trench 54 to the semiconductor substrate 12 is etched. In the present first embodiment, the insulating layer 22 is etched in the following two stages: trench-side etching being such that a portion relatively close to the bottom surface of the trench 54 is etched, and substrate-side etching being such that a portion relatively close to the semiconductor substrate 12 is etched.

First, trench-side etching is performed. Specifically, the region of the insulating layer 22 exposed from the sidewall protective film 94 is etched in an anisotropic manner by RIE techniques. As a result, the insulating layer 22 is etched to the position of a broken line in FIG. 1D. Since the insulating layer 22 remains on the semiconductor layer 12, the semiconductor substrate 12 is not damaged by plasma or the like in the RIE step.

Then, the substrate side of the insulating layer 22 is etched. Specifically, by wet etching using NH4F solution or the like, the insulating layer 22 is etched until the semiconductor substrate 12 is exposed. Since wet etching chemically etches the insulating layer 22, it causes no damage to the semiconductor substrate 12. Consequently, the semiconductor substrate 12 has relatively fewer crystal defects.

Since the insulating layer 22 has been etched anisotropically to the broken line in FIG. 1D, even if the remaining insulating film 22 is etched isotropically in wet etching, the width of the insulating layer 22 etched in a lateral direction perpendicular to the direction going toward the surface of the semiconductor substrate 10 is less than that in the prior art. The width of the side-etched insulating layer 22 depends on the distance from the broken line in FIG. 1D to the surface of the semiconductor substrate 12, that is, on the remaining film thickness Trf of the insulating layer 22 remaining after the trench-side etching.

Accordingly, even when the protective layer 92 is thinner than the insulating film 22, adjusting the remaining film thickness Trf prevents the insulating layer 22 from being side-etched to the lower surface of the semiconductor layer 32. Thus, the semiconductor layer 32 is not exposed. The remaining film thickness Trf is smaller than the thickness Tsp of the sidewall protective film 94 from the side surface of the semiconductor layer 32. For example, the remaining film thickness Trf is about 50 nm and the thickness Tsp is about 100 nm.

Figure 1E:
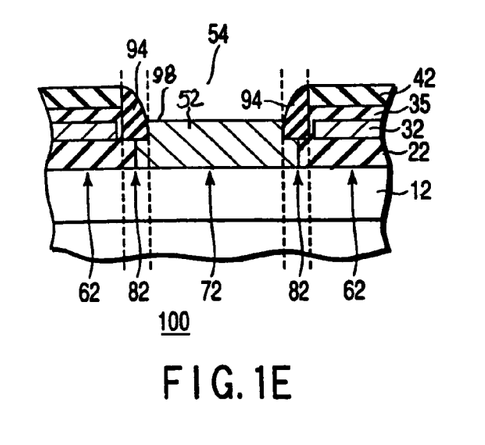
FIG. 1E shows a sectional view of the semiconductor device substrate in a step of the method of manufacturing a semiconductor device substrate according to the first embodiment of the present invention.

In FIG. 1E, a single crystal is grown epitaxially from the surface of the semiconductor substrate 12, thereby forming a single-crystalline layer 52 in the trench 54. In the present first embodiment, the single-crystalline layer 52 is formed by a selective epitaxial growth method. Since the surface of the semiconductor substrate 12 is exposed and the semiconductor layer 32 is not exposed, a single crystal grows from the semiconductor substrate 12 but does not grow from the semiconductor layer 32.

Here, in the semiconductor substrate 12, it is assumed that the region where the insulating layer 22 and semiconductor layer 32 exist is an insulating region 62 and the region where neither the insulating layer 22 nor the semiconductor layer 32 exists and the single-crystalline layer 52 is formed is a non-insulating region 72. The region where the sidewall protective film 94 is formed and the region where one of the insulating layer 22 and semiconductor layer 32 remains and the other does not remain are assumed to be a boundary region 82. In the accompanying drawings, each of the insulating region 62, non-insulating region 72, and boundary region 82 is distinguished by a broken line.

Since a single crystal grows from the semiconductor substrate 12 but does not grow from the semiconductor layer 32, no bump is formed in and around the boundary region 82. Therefore, no crystal defect develops in the surface of the single-crystalline layer 52 in and around the boundary region 82.

In the present first embodiment, since the mask layers 35 and 42 are removed in a later process, the single-crystalline layer 52 is so formed that the surface of the single-crystalline layer 52 and the surface of the semiconductor layer 32 are in the same plane. As a result, the substrate surface 98 of the semiconductor device substrate 100 is flat after the mask layers 35, 42 are removed. In this way, a semiconductor device substrate 100 with a flat substrate surface 98 is formed.

Since the sidewall protective film 94 is made of nitride material, when the mask layers 35, 42 are removed by ashing or the like, the sidewall protective film 94 is removed to the surface of the semiconductor layer 32. Therefore, the flat substrate surface 98 is formed from the insulating region 62 to the non-insulating region 72 via the boundary region 82. In this way, the semiconductor device substrate 100 is formed.

Therefore, the semiconductor device substrate 100 comprises the semiconductor substrate 12, the insulating region 62 where the electrically insulating layer 22 and the semiconductor layer 32 insulated by the insulating layer 22, the non-insulating layer 72 having the single-crystalline layer 52 formed in the surface of the semiconductor substrate 12, and the sidewall protective film 94 covering at least the side surface of the semiconductor layer 32 existing in the boundary region 82 between the insulating region 62 and the non-insulating region 72.

The side surface of the insulating layer 22 existing in the boundary region 82 between the insulating region 62 and the non-insulating region 72 is closer to the non-insulating region 72 than the side surface of the semiconductor layer 32.

In each of the insulating region 62 and non-insulating region 72 of the semiconductor device substrate 100, a semiconductor device suitable for the characteristic of the corresponding region can be formed.

FIGS. 2A-2D show sectional views of a semiconductor device substrate in the order of steps to help explain a method of manufacturing a semiconductor device substrate according to a second embodiment of the present invention. FIG. 2E is an enlarged view of the part enclosed by a broken-line circle Z in FIG. 2C.

Figure 2A:
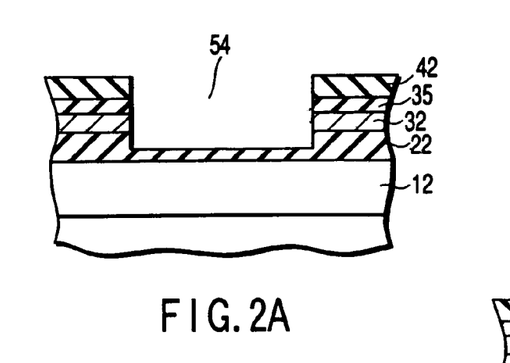
FIG. 2A shows a sectional view of a semiconductor device substrate in a step of a method of manufacturing a semiconductor device substrate according to a second embodiment of the present invention.

In FIG. 2A, on a semiconductor substrate 12, an insulating layer 22, a semiconductor layer 32 and mask layers 35, 42 are formed, and then the mask layers 35, 42 are patterned. The semiconductor layer 32 and a part of the insulating layer 22 are selectively etched anisotropically by RIE techniques according to the patterned mask layers 35, 42. That is, a trench 54 is formed and, at the same time, the trench side of the insulating layer 22 is etched. As a result, the trench 54 reaching the insulating layer 22 is formed. The trench 54 is such that the portion of the insulating layer 22 exposed as a result of etching the semiconductor layer 32 is the bottom surface of the trench 54 and the side portions of the semiconductor layer 32 and insulating layer 22 exposed as a result of etching the semiconductor layer 32 are the side surface.

Figure 2B:
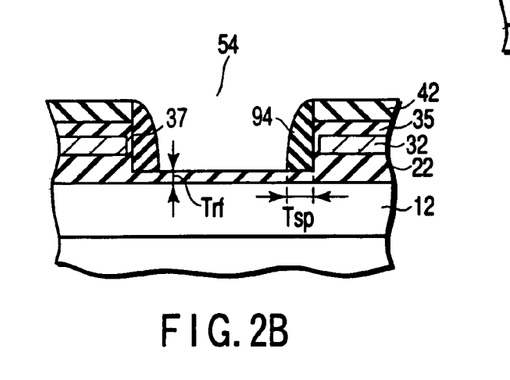
FIG. 2B shows a sectional view of the semiconductor device substrate in a step of the method of manufacturing a semiconductor device substrate according to the second embodiment of the present invention.

In FIG. 2B, a sidewall protective film 94 is formed on the side surface of the trench 54 as in the first embodiment. Since the side surface of the trench 54 is composed of the side portions of the semiconductor layer 32 and insulating layer 22 differently from the first embodiment, the sidewall protective film 94 covers not only the side portion of the semiconductor layer 32 but also the side portion of the insulating layer 22.

Figure 2C:
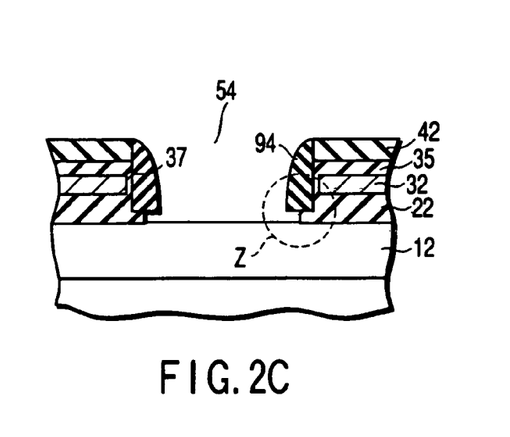
FIG. 2C shows a sectional view of the semiconductor device substrate in a step of the method of manufacturing a semiconductor device substrate according to the second embodiment of the present invention.

In FIG. 2C, the insulating layer 22 remaining from the bottom surface of the trench 54 to the semiconductor substrate 12 is wet-etched. That is, a substrate-side etching of the insulating layer 22 is performed. In this way, in the present second embodiment, the substrate-side etching of the insulating layer 22 is performed after the trench-side etching is performed and then the sidewall protective film 94 is formed.

In the substrate-side etching, a part of the insulating layer 22 on the trench 54 side has been etched already in the trench-side etching. As a result, the part of the insulting layer 22 remaining relatively close to the semiconductor substrate 12 is etched isotropically in the substrate-side etching. Consequently, even when the protective layer 92 (see FIG. 1B) is thinner than the insulating layer 22, adjusting the remaining film thickness Trf of the insulating layer 22 prevents the insulating layer 22 from being side-etched to the lower surface of the semiconductor layer 32.

In the present second embodiment, the remaining film thickness Trf can be made smaller than the thickness Tsp of the sidewall protective film 94 from the side face of the semiconductor layer 32. That is, in the substrate-side etching, the semiconductor device substrate 200 has a lateral margin equivalent to the difference between the remaining film thickness Trf and the thickness Tsp of the sidewall protective film 94. Accordingly, after the substrate-side etching, the semiconductor layer 32 is not exposed.

Furthermore, the semiconductor device substrate 200 has a vertical margin equivalent to the thickness of the insulating layer 22 already etched in the trench-side etching. As a result, even when etching is done further, the semiconductor layer 32 is not exposed.

FIG. 2E is an enlarged view of the part enclosed by a broken-line circle Z in over-etching beyond the thickness Tsp of the sidewall protective film 94 in the substrate-side etching. In FIG. 2E, the vertical margin is represented by Tmg. The thickness Tmg is equal to the thickness of the insulating layer 22 already etched in the trench-side etching. In the substrate-side etching, even when over-etching is done beyond the thickness Tsp of the sidewall protective film 94, the semiconductor layer 32 is not exposed.

Therefore, in the present second embodiment, the substrate-side etching, the insulating layer 22 can be etched as much as the sum of Tsp and Tmg. That is, when both the lateral margin and vertical margin are taken into account, the total margin is the sum of Tsp and Tmg.

In the present second embodiment, since the insulating layer 22 is wet-etched until the semiconductor substrate 12 is exposed, crystal defects are less liable to occur in the semiconductor substrate 12.

Figure 2D:
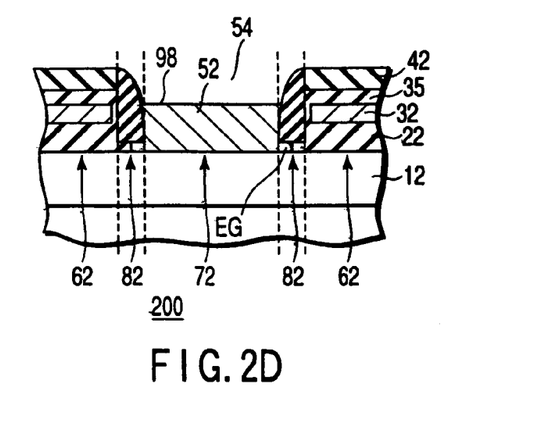
FIG. 2D shows a sectional view of the semiconductor device substrate in a step of the method of manufacturing a semiconductor device substrate according to the second embodiment of the present invention.
Figure 2E:
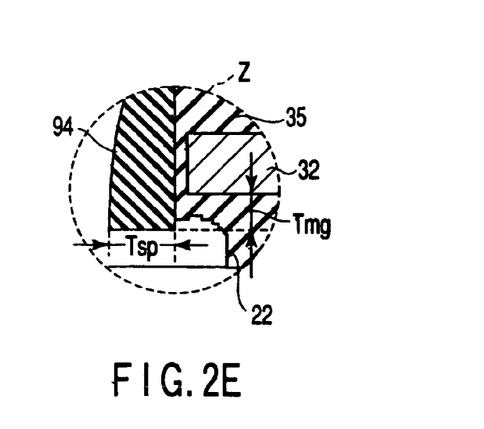
FIG. 2E is an enlarged view of the part enclosed by a broken-line circle Z in FIG. 2C, when an etching of the insulating layer 22 was over-etching.

In FIG. 2D, a single-crystalline layer 52 is grown epitaxially from the surface of the semiconductor substrate 12, thereby forming the single-crystalline layer 52 in the trench 52.

As in the first embodiment, since the surface of the semiconductor substrate 12 is exposed and the semiconductor layer 32 is not exposed, the single-crystalline layer 52 grows epitaxially from the semiconductor substrate 12 but does not grow from the semiconductor layer 32.

Therefore, no bump is formed in and around the boundary region 82. Consequently, no crystal defect occurs in the surface of the single-crystalline layer 52 in and around the boundary region 82. Since in the present second embodiment, the mask layers 35 and 42 are removed in a later process, the single-crystalline layer 52 is so formed that the surface of the single-crystalline layer 52 and the surface of the semiconductor layer 32 are in the same plane. As a result, the substrate surface 98 of the semiconductor device substrate 200 becomes flat after the mask layers 35, 42 are removed. In this way, a semiconductor device substrate 200 with a flat substrate surface 98 is formed.

Since the sidewall protective film 94 is made of nitride material, when the mask layers 35, 42 are removed by ashing or the like, the sidewall protective film 94 is removed to the surface of the semiconductor layer 32. Therefore, the flat substrate surface 98 is formed from the insulating region 62 to the non-insulating region 72 via the boundary region 82. In this way, the semiconductor device substrate 200 is formed.

The semiconductor device substrate 200 is so formed that the side surface of the insulating layer 22 close to the semiconductor substrate 12 is closer to the non-insulating region 72 than the sidewall of the semiconductor layer 32.

In FIG. 2D, depending on the condition for growing the single-crystalline layer 52, a space may appear at the edge EG between the sidewall protective film 94 and the insulating layer 22.

FIGS. 3A-3D show sectional views of a semiconductor device substrate in the order of steps to help explain a method of manufacturing a semiconductor device substrate according to a third embodiment of the present invention.

Figure 3A:
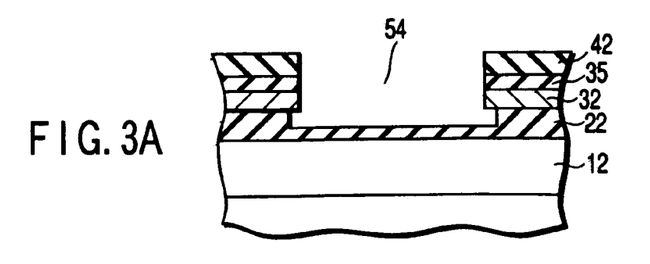
FIG. 3A shows a sectional view of a semiconductor device substrate in a step of a method of manufacturing a semiconductor device substrate according to a third embodiment of the present invention.

In FIG. 3A, on a semiconductor substrate 12, an insulating layer 22, a semiconductor layer 32 and mask layers 35, 42 are formed, and then the mask layers 35, 42 are patterned.

Next, the semiconductor layer 32 is selectively etched anisotropically by RIE techniques according to the patterned mask layers 35, 42. As a result, the trench 54 reaching the insulating layer 22 is formed. The trench 54 is such that the surface portion of the insulating layer 22 exposed as a result of etching the semiconductor layer 32 is the bottom surface of the trench 54 and the side portion of the semiconductor layer 32 exposed as a result of etching the semiconductor layer 32 is the side surface.

Furthermore, a part of the trench 54 side of the insulating layer 22 is wet-etched. That is, the trench side of the insulating layer 22 is etched. Since the insulating layer 22 is etched isotropically in wet etching, the insulating layer 22 existing under the semiconductor layer 32 is etched toward the side surface of the trench 54, that is, in a lateral direction perpendicular to the direction going toward the surface of the semiconductor substrate 12. As a result, the side portion and bottom portion of the semiconductor layer 32 are exposed.

Figure 3B:
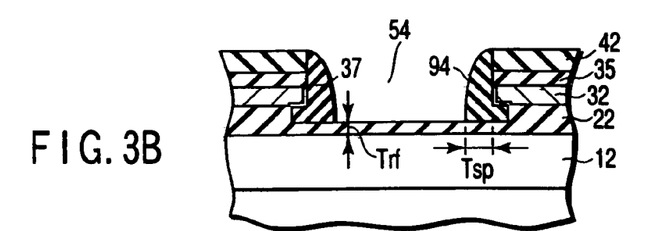
FIG. 3B shows a sectional view of the semiconductor device substrate in a step of the method of manufacturing a semiconductor device substrate according to the third embodiment of the present invention.

In FIG. 3B, a sidewall protective film 94 is formed on the side face of the trench 54 in the manner as in the first embodiment. The sidewall protective film 94 is formed not only on the side of the semiconductor layer 32 but also under the semiconductor layer 32 where the side-etched insulating layer 22 existed. Thus, even when the deposited protective layer 92 is thinner than the insulating layer 22, since the thickness Tsp of the sidewall protective film 94 from the side surface of the insulating layer 22 is larger than the remaining film thickness Trf of the insulating layer 22, the semiconductor layer 32 is not exposed even after subsequent substrate-side etching.

Figure 3C:
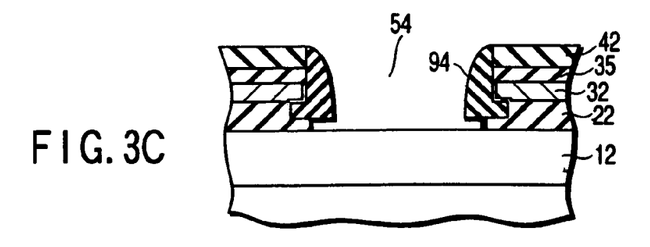
FIG. 3C shows a sectional view of the semiconductor device substrate in a step of the method of manufacturing a semiconductor device substrate according to the third embodiment of the present invention.

In FIG. 3C, the insulating layer 22 existing from the bottom surface of the trench 54 to the semiconductor substrate 12 is wet-etched. That is, in the present third embodiment, the substrate side of the insulating layer 22 is etched after the trench-side etching is done and the sidewall protective film 94 is formed.

As in the second embodiment, a part of the trench 54 side of the insulating layer 22 has already been etched in the trench-side etching. Thus, in the substrate-side etching, the part of the insulating layer 22 remaining relatively close to the semiconductor substrate 12 is etched isotropically in the substrate-side etching. As a result, even when the deposited protective layer 92 is thinner than the insulating layer 22, adjusting the film thickness Trf of the remaining insulating layer 22 prevents the insulating layer 22 from being side-etched to the lower surface of the semiconductor layer 32. Accordingly, the semiconductor layer 32 is not exposed. The remaining film thickness Trf is smaller than the thickness Tsp of the sidewall protective film 94 from the side surface of the insulating layer 22.

As in FIG. 2E, a vertical margin may be taken into account. With this margin, even when the insulating layer 22 is side-etched more than the thickness Tsp in the substrate-side etching, the semiconductor layer is not exposed.

Generally, it cannot determined clearly what remaining film thickness Trf of the insulating layer 22 protects the semiconductor substrate 12 from damage caused by plasma in RIE techniques.

In the present third embodiment, however, both the trench-side etching and the substrate-side etching are isotropic. Therefore, since the insulating layer 22 is not etched by RIE, there is no possibility that the semiconductor substrate 12 will be damaged by the trench-side etching via the insulating layer 22. Consequently, crystal defects are much less liable to occur in the semiconductor substrate 12.

Figure 3D:
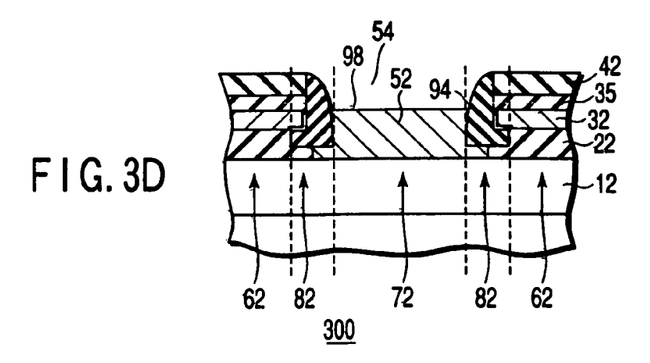
FIG. 3D shows a sectional view of the semiconductor device substrate in a step of the method of manufacturing a semiconductor device substrate according to the third embodiment of the present invention.

In FIG. 3D, a single-crystalline layer 52 is grown epitaxially from the surface of the semiconductor substrate 12, thereby forming the single-crystalline layer 52 in the trench 54.

Since the surface of the semiconductor substrate 12 is exposed and the semiconductor layer 32 is not exposed as in the first embodiment, the single-crystalline layer 52 grows epitaxially from the semiconductor substrate 12 but does not grow from the semiconductor layer 32.

As a result, no bump is formed in and around the boundary region 82, which prevents crystal defects from occurring.

In the present third embodiment, since the mask layers 35 and 42 are removed in a later process, the single-crystalline layer 52 is so formed that the surface of the single-crystalline layer 52 and the surface of the semiconductor layer 32 are in the same plane. As a result, the substrate surface 98 of the semiconductor device substrate 100 is flat after the mask layers 35, 42 are removed. In this way, a semiconductor device substrate 100 with a flat substrate surface 98 is formed.

Since the sidewall protective film 94 is made of nitride material, when the mask layers 35, 42 are removed by ashing or the like, the sidewall protective film 94 is also removed to the surface of the semiconductor layer 32. Therefore, the flat substrate surface 98 is formed from the insulating region 62 to the non-insulating region 72 via the boundary region 82. In this way, the semiconductor device substrate 300 is formed.

In the semiconductor device substrate 300, the side surface of the insulating layer 22 close to the semiconductor substrate 12 is closer to the non-insulating region 72 than the sidewall of the semiconductor layer 32. In addition, the side surface of the insulating layer 22 close to the semiconductor layer 32 is closer to the insulating region 82 than the sidewall of the semiconductor layer 32.

FIGS. 4A-4D show sectional views of a semiconductor device substrate in the order of steps to help explain a method of manufacturing a semiconductor device substrate according to a fourth embodiment of the present invention. FIG. 4E is an enlarged view of the part enclosed by a broken-line circle Z in FIG. 4A, when an etching of the semiconductor layer 32 was over-etching.

Figure 4A:
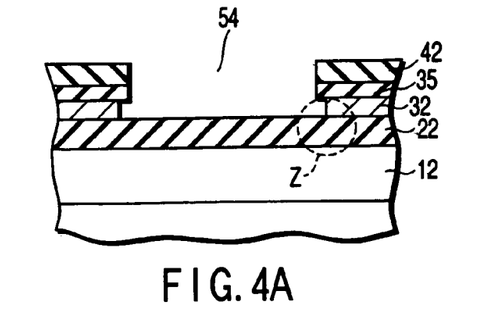
FIG. 4A shows a sectional view of a semiconductor device substrate in a step of a method of manufacturing a semiconductor device substrate according to a fourth embodiment of the present invention.

In FIG. 4A, on a semiconductor substrate 12, an insulating layer 22, a semiconductor layer 32 and mask layers 35, 42 are formed, and then the mask layers 35, 42 are patterned. The semiconductor layer 32 is selectively etched isotropically according to the patterned mask layers 35, 42. As a result, the trench 54 reaching the insulating layer 22 is formed. This causes the semiconductor layer 32 existing under the mask layers 35, 42 to be side-etched toward the side surface of the trench 54. That is, the semiconductor layer 32 is side-etched in a lateral direction perpendicular to the direction going toward the surface of the semiconductor substrate 12.

Figure 4B:
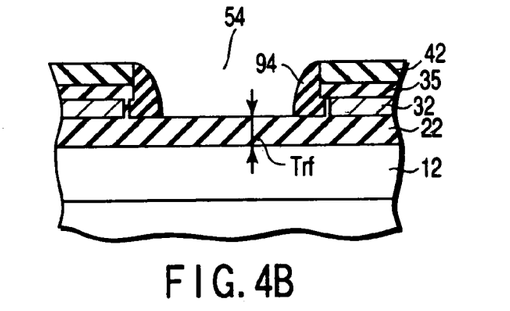
FIG. 4B shows a sectional view of the semiconductor device substrate in a step of the method of manufacturing a semiconductor device substrate according to the fourth embodiment of the present invention.

In FIG. 4B, a sidewall protective film 94 is formed on the side face of the trench 54 in the manner as in the first embodiment. The sidewall protective portion 94 gets into under the mask layers 35, 42, thereby covering the side portion of the semiconductor layer 42. Accordingly, although the film thickness of the protective layer 92 (see FIG. 1B) deposited to form the sidewall protective film 94 is smaller than that of the insulating layer 22, the lateral thickness of the insulating layer 22 from the side surface of the trench 54 is larger than the film thickness of the insulating layer 22.

Figure 4C:
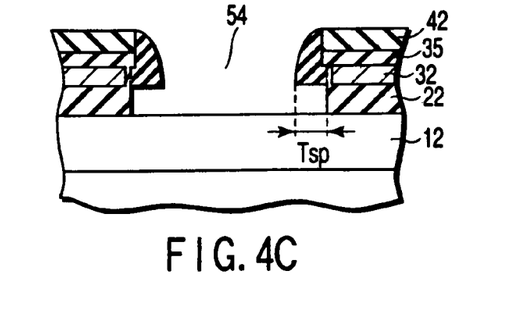
FIG. 4C shows a sectional view of the semiconductor device substrate in a step of the method of manufacturing a semiconductor device substrate according to the fourth embodiment of the present invention.

In FIG. 4C, the insulating layer 22 existing from the bottom surface of the trench 54 to the semiconductor substrate 12 is wet-etched. In the present fourth embodiment, unlike the first to third embodiments, the insulating layer 22 is etched in one wet etching. Since the lateral thickness Tsp of the sidewall protective film 94 from the side surface of the trench 54 is larger than the film thickness Trf of the insulating film 22, even when the insulating layer 22 is side-etched, the semiconductor layer 32 is not exposed.

In the present fourth embodiment, the insulating layer 22 has not been etched in the etching of FIG. 4A. However, a part of the insulating layer 22 may be etched as shown in FIG. 4E. With this etching, the insulating layer 22 is side-etched, with the result that a part of the bottom surface of the semiconductor layer 32 is exposed and the sidewall protective film 94 covers part of the bottom surface of the semiconductor layer 32 in FIG. 4B. Consequently, in the manner as in FIG. 2E, the insulating layer 22 is etched in FIG. 4C, taking into account not only the lateral margin but also the vertical margin. That is, it can be designed that the semiconductor layer 32 is not exposed, even when the insulating layer 22 is etched more than the thickness Tsp.

Figure 4D:
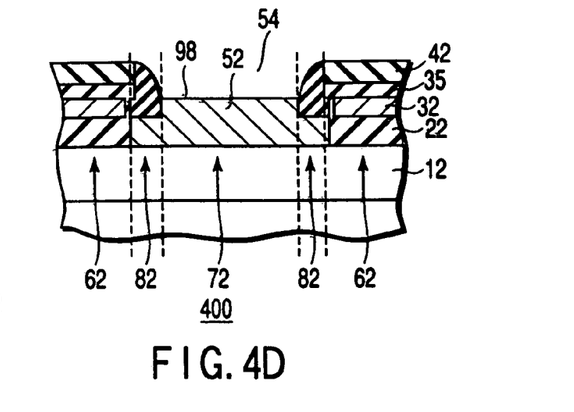
FIG. 4D shows a sectional view of the semiconductor device substrate in a step of the method of manufacturing a semiconductor device substrate according to the fourth embodiment of the present invention.
Figure 4E:
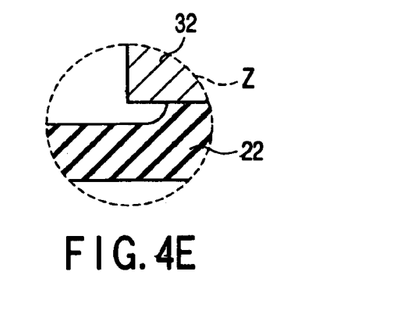
FIG. 4E is an enlarged view of the part enclosed by a broken-line circle Z in FIG. 4A, when an etching of the semiconductor layer 32 was over-etching.

In FIG. 4D, a single-crystalline layer 52 is grown epitaxially from the surface of the semiconductor substrate 12, thereby forming the single-crystalline layer 52 in the trench 54.

Since the surface of the semiconductor substrate 12 is exposed and the semiconductor layer 32 is not exposed in the manner as in the first embodiment, the single-crystalline layer 52 grows epitaxially from the semiconductor substrate 12 but does not grow from the semiconductor layer 32.

As a result, no bump is formed in and around the boundary region 82, which prevents crystal defects from occurring.

In the present fourth embodiment, since the mask layers 35 and 42 are removed in a later process, the single-crystalline layer 52 is so formed that the surface of the single-crystalline layer 52 and the surface of the semiconductor layer 32 are in the same plane. As a result, the substrate surface 98 of the semiconductor device substrate 100 is flat after the mask layers 35, 42 are removed. In this way, a semiconductor device substrate 100 with a flat substrate surface 98 is formed.

Since the sidewall protective film 94 is made of nitride material, when the mask layers 35, 42 are removed by ashing or the like, the sidewall protective film 94 is also removed to the surface of the semiconductor layer 32. Therefore, the flat substrate surface 98 is formed from the insulating region 62 to the non-insulating region 72 via the boundary region 82. In this way, the semiconductor device substrate 400 is formed.

In the semiconductor device substrate 400, the side surface of the semiconductor layer 12 existing in the boundary between the insulating region 62 and the non-insulating region 72 are both closer to the insulating region 62 side than the side surfaces of the mask layers 35, 42 existing in the boundary between the insulating region 62 and the non-insulating region 72.

Figure 5A:
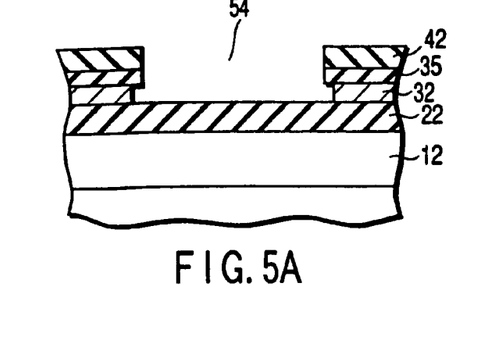
FIG. 5A shows a sectional view of a semiconductor device substrate in a step of a method of manufacturing a semiconductor device substrate according to a fifth embodiment of the present invention.
Figure 5B:
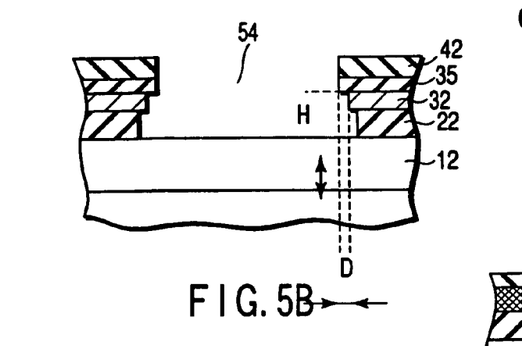
FIG. 5B shows a sectional view of the semiconductor device substrate in a step of the method of manufacturing a semiconductor device substrate according to the fifth embodiment of the present invention.
Figure 5C:
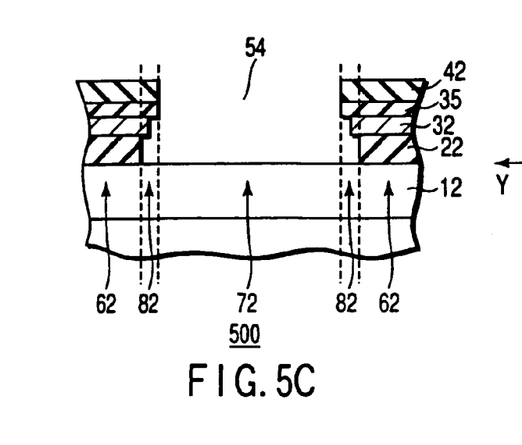
FIG. 5C shows a sectional view of the semiconductor device substrate in a step of the method of manufacturing a semiconductor device substrate according to the fifth embodiment of the present invention.

FIGS. 5A-5C show sectional views of a semiconductor device substrate in the order of steps to help explain a method of manufacturing a semiconductor device substrate according to a fifth embodiment of the present invention.

FIG. 5A shows a similar state to that of FIG. 4A. Thus, the semiconductor layer 32 under the mask layers 35, 42 has been side-etched toward the side surface of the trench 54.

FIG. 5B shows a state where the insulating layer 22 has been etched. In the present fifth embodiment, unlike the first to fourth embodiments, no sidewall protective portion is formed. Since the insulating layer 22 is wet-etched, it is side-etched in a lateral direction perpendicular to the direction going toward the surface of the semiconductor substrate 12.

In the present fifth embodiment, both the semiconductor layer 32 and the insulating layer 22 are wet-etched. Thus, the side surface of the semiconductor layer 32 and the side surface of the insulating layer 22 are closer to the insulating region 62 than the side faces of the mask layers 35, 42 existing in the boundary between the insulating region 62 and the non-insulating region 72. The insulating layer 22 is wet-etched after the semiconductor layer 32 is etched. Thus, the side surface of the insulating layer 22 is closer to the insulating region 62 than the side surface of the semiconductor layer 32. As a result, the mask layers 35, 42, the semiconductor layer 32, and the insulating layer 22 are formed in reverse stairs.

Furthermore, the distance H from the surface of the semiconductor substrate 12 to the surface of the semiconductor layer 32 and the distance D from the side surface of the semiconductor layer 32 to the side surface of the mask layer 35 or 42 satisfy the following expression: $D/H \geqq 0.75$. The reason will be described below.

In FIG. 5C, a single crystal is grown epitaxially from the surface of the semiconductor substrate 12 and the side surface of the semiconductor layer 32, thereby forming a single-crystalline layer 52 in the trench 54.

Generally, when silicon is grown epitaxially, the ratio of the growth rate of a silicon crystal growing in the direction X perpendicular to the crystal plane (100) of a silicon substrate to the growth rate of a silicon crystal growing in the direction Y perpendicular to the crystal plane (010) of the silicon substrate is 1:075.

In the present fifth embodiment, the surface of the semiconductor substrate 12 corresponds to the crystal plane (100) and the side surface of the semiconductor layer 32 corresponds to the crystal plane (010).

Although a crystal also grows from the side surface of the semiconductor layer 32, the mask layer 35 prevents the crystal from the side surface of the semiconductor layer 32 from growing beyond the surface of the semiconductor surface 32 toward the outside of the trench 54. For the crystal from the semiconductor layer 32 to grow beyond the surface of the semiconductor layer 32, the crystal from the side surface of the semiconductor layer 32 has to grow more than the distance D in a lateral direction, that is, in the direction Y.

On the other hand, the crystal growing from the surface of the semiconductor substrate 12 grows 1/0.75=about 1.33 times as fast as the rate at which the crystal grows in the direction X.

Therefore, in the present fifth embodiment, when the distance H and distance D satisfy the expression $D/H \geqq 0.75$, the crystal growing from the surface of the semiconductor substrate 12 exceeds the surface of the semiconductor layer 32 before the crystal growing from the semiconductor layer 32 exceeds the surface of the semiconductor layer 32. As a result, no bump is formed on the surface of the single-crystalline layer 52 formed in the non-insulating region 72, which prevents crystal defects from occurring.

In the present fifth embodiment, since the mask layers 35 and 42 are removed in a later process, the single-crystalline layer 52 is so formed that the surface of the single-crystalline layer 52 and the surface of the semiconductor layer 32 are in the same plane. As a result, the substrate surface 98 of the semiconductor device substrate 100 is flat after the mask layers 35, 42 are removed. In this way, a semiconductor device substrate 100 with a flat substrate surface 98 is formed. Accordingly, the substrate surface 98 that is flat from the insulating region 62 to the non-insulating region 72 via the boundary region 82 is formed.

Therefore, in the present fifth embodiment, it is possible to form a flat semiconductor device substrate 500 with fewer crystal defects without providing a sidewall protective layer 92.

In the above described embodiments, the shape and material of the sidewall protective film 94 and the film thickness or remaining film thickness Trf of the insulating layer 22 may be changed by adjusting the depositing process and the etching process. Such adjustments make it easy for those skilled in the art to prevent the semiconductor layer 32 from being exposed after the substrate-side etching of the insulating layer 22.

According to a method of manufacturing a semiconductor device substrate of the present invention, there is provided a semiconductor device substrate which has fewer defects in the crystals in the surface of the substrate and which has a flat surface with no step between the SOI-structure region and the non-SOI-structure region.

A semiconductor device substrate according to the present invention has not only fewer defects in the crystals in the surface of the substrate but also a flat surface with no step between the SOI-structure region and the non-SOI-structure region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device substrate, comprising:
    forming a mask layer pattern above semiconductor layer insulated from a surface of a semiconductor substrate by an electrically insulating layer;
    etching the semiconductor layer in accordance with the pattern of the mask layer to form a trench exposing the insulting layer;
    forming a protective layer on a side wall of the semiconductor layer and the insulating layer so that a part of a surface of the insulating layer is exposed;
    etching the insulating layer by an isotropic etching method to expose a surface of the semiconductor substrate; and
    growing a single-crystalline layer from the surface of the semiconductor substrate.

2. The method of manufacturing a semiconductor device substrate according to claim 1, wherein,
    in the forming of the trench, the semiconductor layer is etched isotropically and the semiconductor layer under the mask layer is etched toward the side surface of the trench, and
    in the forming of the sidewall protective film, the sidewall protective film is formed under the semiconductor layer where the semiconductor layer etched in forming the trench existed, and the etching of the insulating layer is isotropic etching.

3. The method of manufacturing a semiconductor device substrate according to claim 1, wherein the etching of the semiconductor layer is performed by an anisotropic etching method.

4. The method of manufacturing a semiconductor device substrate according to claim 3, wherein the isotropic etching is wet etching performed in liquid phase and the anisotropic etching is dry etching performed in gaseous phase.

5. The method of manufacturing a semiconductor device substrate according to claim 1, wherein the etching of the semiconductor layer removes a part of the insulating layer.

6. The method of manufacturing a semiconductor device substrate according to claim 5, wherein the trench-side etching and the substrate-side etching are both isotropic etching, the insulating layer under the semiconductor layer being etched toward the side surface of the trench in the trench-side etching, and the forming of the sidewall protective film is executed after the trench-side etching and before the substrate-side etching, and the sidewall protective film is formed on the side surface of the trench and under the semiconductor layer where the insulating layer etched by the trench-side etching existed.

7. The method of manufacturing a semiconductor device substrate according to claim 6, wherein the isotropic etching is wet etching performed in liquid phase and the anisotropic etching is dry etching performed in gaseous phase.

* * * * *